(12) United States Patent
Horovitz et al.

(10) Patent No.: US 7,398,493 B2
(45) Date of Patent: Jul. 8, 2008

(54) ISOLATED PWELL TANK VERIFICATION USING NODE BREAKERS

(75) Inventors: Haim Horovitz, Los Altos, CA (US); Mark Allenspach, Grand Prairie, TX (US); Peter Fleischmann, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 278 days.

(21) Appl. No.: 11/374,259

(22) Filed: Mar. 13, 2006

(65) Prior Publication Data
US 2007/0214441 A1    Sep. 13, 2007

(51) Int. Cl.
G06F 17/50  (2006.01)
(52) U.S. Cl. ................... 716/5; 716/1; 716/4
(58) Field of Classification Search ............ 716/5, 716/4, 1
See application file for complete search history.

(56) References Cited

U.S. PATENT DOCUMENTS

| | | | |
|---|---|---|---|
| 6,009,251 A | 12/1999 | Ho et al. | |
| 6,986,113 B2 | 1/2006 | Sinha et al. | |
| 2004/0187085 A1 | 9/2004 | Sinha et al. | |
| 2005/0223347 A1 | 10/2005 | Okuaki | |

*Primary Examiner*—Sun James Lin
(74) *Attorney, Agent, or Firm*—Wade J. Brady, III; Frederick J. Telecky, Jr.

(57) ABSTRACT

A technique for checking a layout design of an integrated circuit is disclosed. The technique has application to converting the design of a circuit from schematic to layout form. Instances where multiple pwell isolation tanks are coupled to the same node and where one or more pwell isolation tanks are shorted to a substrate are detected. Node breakers are inserted in the layout between pwell isolation tanks coupled to the same node and between the substrate and isolated pwell tanks coupled to the substrate. The node breakers are inserted in the circuit schematic as well to satisfy a layout versus schematic comparison. Inserting the node breakers highlights circuit component groupings as well as which tanks contain certain elements, if any. This allows designers to make a conscious decision as to the location and groupings of elements in a layout design.

20 Claims, 5 Drawing Sheets

ISOLATED PWELL TANK VERIFICATION USING NODE BREAKERS

FIELD OF INVENTION

The present invention relates generally to semiconductor fabrication, and more particularly to verifying device isolation within pwells in view of design rule checking (DRC) and layout versus schematic (LVS) comparisons.

BACKGROUND OF THE INVENTION

It will be appreciated that integrated circuits (IC's) and/or semiconductor chips can be represented in both schematic and layout form. In schematic form, electrical elements or components of the circuit are represented as known symbols, and the symbols are interconnected to one another according the circuit design. It will also be appreciated, however, that the symbols bear little to no resemblance to the actual elements because the elements are implemented in and on a semiconductor substrate, such as a silicon wafer or one or more die on the wafer as regions of silicon are treated in one or more manners and/or as one or more layers formed upon the silicon are treated in one or more manners, such as by being doped with dopant atoms and/or etched to comprise a certain pattern, for example. As such, the circuit can also be depicted in layout form where the elements and particular arrangement thereof correspond more closely to their actual implementation in silicon.

It will be appreciated that integrated circuits are generally designed by drawing a schematic of the circuit such that electrical elements are interconnected to achieve a desired result. The circuit schematic is then converted to a layout form so that the circuit can be fabricated in silicon. A layout versus schematic (LVS) comparison can then be performed (e.g., in computer software) to verify that everything in the schematic is in fact in the physical implementation, or rather that the physical implementation of the circuit matches its logical (schematic) definition.

Nevertheless, some issues may persist in transferring the design from a circuit schematic to layout form, and such issues may not be detectable by LVS comparisons and/or other conventional verification techniques. By way of example, it can be appreciated that certain elements or groupings of elements are commonly isolated from other elements in integrated circuits. The elements are generally isolated from one another by isolated pwells within which the elements are formed. The tanks or isolated pwells are defined above one or more buried layers within the semiconductor substrate and are surrounded by a substantially circular wall of dopant atoms implanted into the substrate, called an nwell. However, multiple isolated pwell tanks may, in certain instances, be coupled to the same potential or bias voltage (which may also be referred to as being coupled to the same node). Additionally, this potential may, at times, correspond to the potential of the substrate where one or more tanks are shorted or otherwise coupled to the substrate.

Having isolation pwells at the same potential and/or at the potential of the substrate can, however, lead to problems that are undetectable by LVS comparisons and/or other conventional verification techniques. For example, where two tanks are coupled to the same node, conventional verification programs would not be able to detect a situation where one or more elements are formed within the wrong tank and/or where multiple elements are not grouped together in a desired manner, for example. An LVS program would not detect these problems, for example, because the number of elements in the schematic would match the number of elements in the layout diagram and all of the elements would be subject to the appropriate node voltage (e.g., in accordance with the circuit design). Similarly, where a tank is shorted to a substrate, an LVS program would not detect a situation where devices are inadvertently formed outside (or inside) of the tank, but are supposed to be in (or out of) the tank since the number of elements in the schematic would match up with the number of elements in the layout diagram and the elements would be subject to the appropriate bias (e.g., substrate) voltage.

Accordingly, a scheme that facilitates isolated pwell tank verification would be desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

A technique for checking a layout design of an integrated circuit is disclosed. The technique has application to converting the design of a circuit from schematic to layout form. Instances where multiple pwell isolation tanks are coupled to the same node and where one or more pwell isolation tanks are shorted to a substrate are detected and/or flagged by a design rule checker (DRC). Node breakers are inserted in the layout between pwell isolation tanks coupled to the same node and between the substrate and isolated pwell tanks coupled to the substrate. The node breakers are similarly inserted in the circuit schematic to satisfy a layout versus schematic (LVS) comparison. Inserting the node breakers highlights circuit component groupings as well as which tanks contain certain elements, if any. This allows designers to make a conscious decision as to the location and groupings of elements in a layout design.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
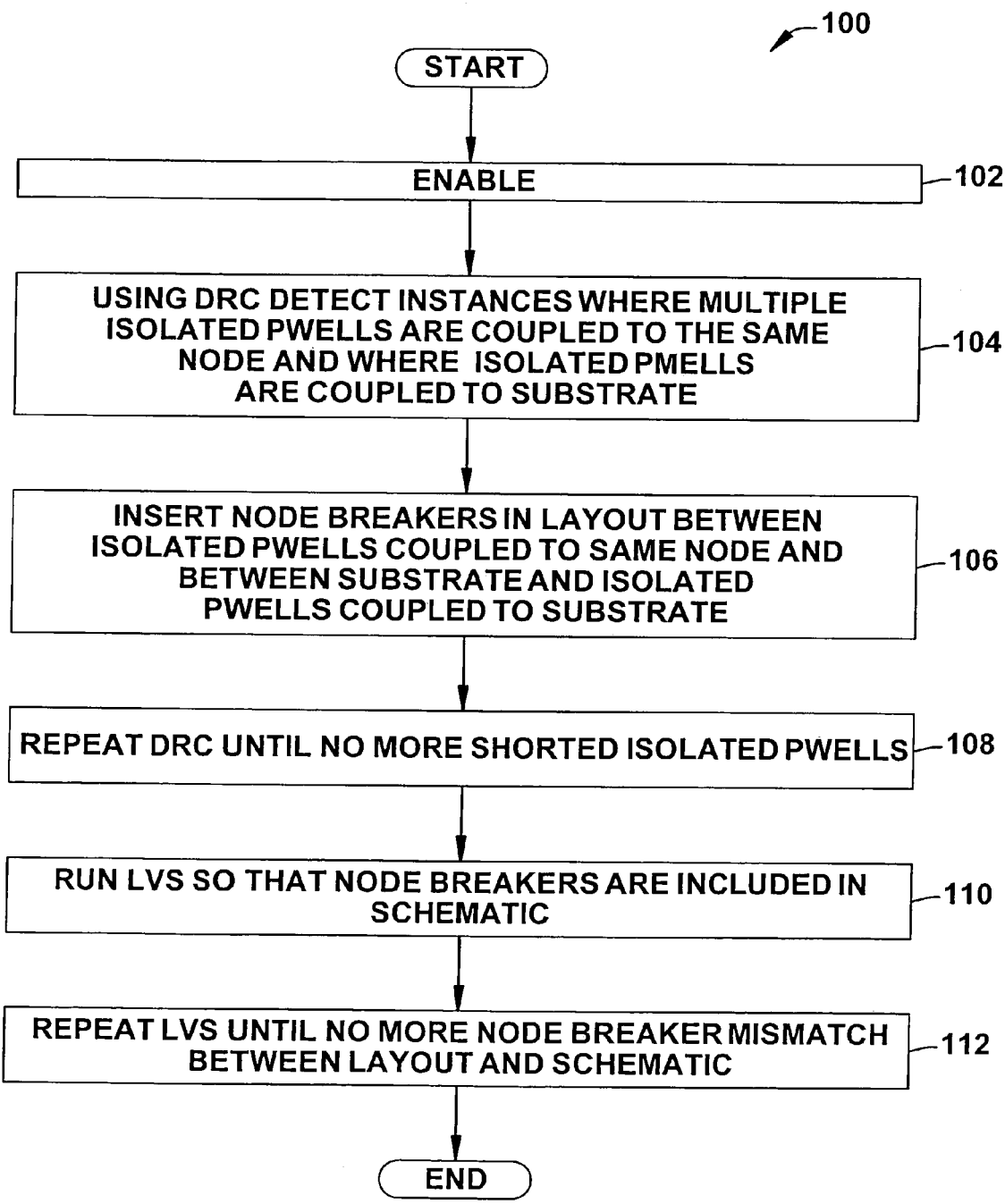
FIG. 1 is a flow diagram illustrating a method for isolated pwell verification according to one or more aspects or embodiments of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

With reference to FIG. 1, a method 100 is illustrated for verifying device isolation within pwells in view of design rule checking (DRC) and layout versus schematic comparisons. The method 100 has application to converting a schematic of a circuit design to a layout form for implementing the circuit in silicon. The method begins at 102 where an enable action is taken. It will be appreciated that the method as described herein may be implemented in computer software and/or run on a processor based system. Accordingly, 102 may correspond to beginning a program and/or to a designer or user clicking an enable box in a software package (or otherwise making an affirmative gesture). Additionally, 102 may be optional so that the method occurs automatically when a schematic is converted (e.g., via software) to layout form to implement a circuit design in silicon.

Figure 2:
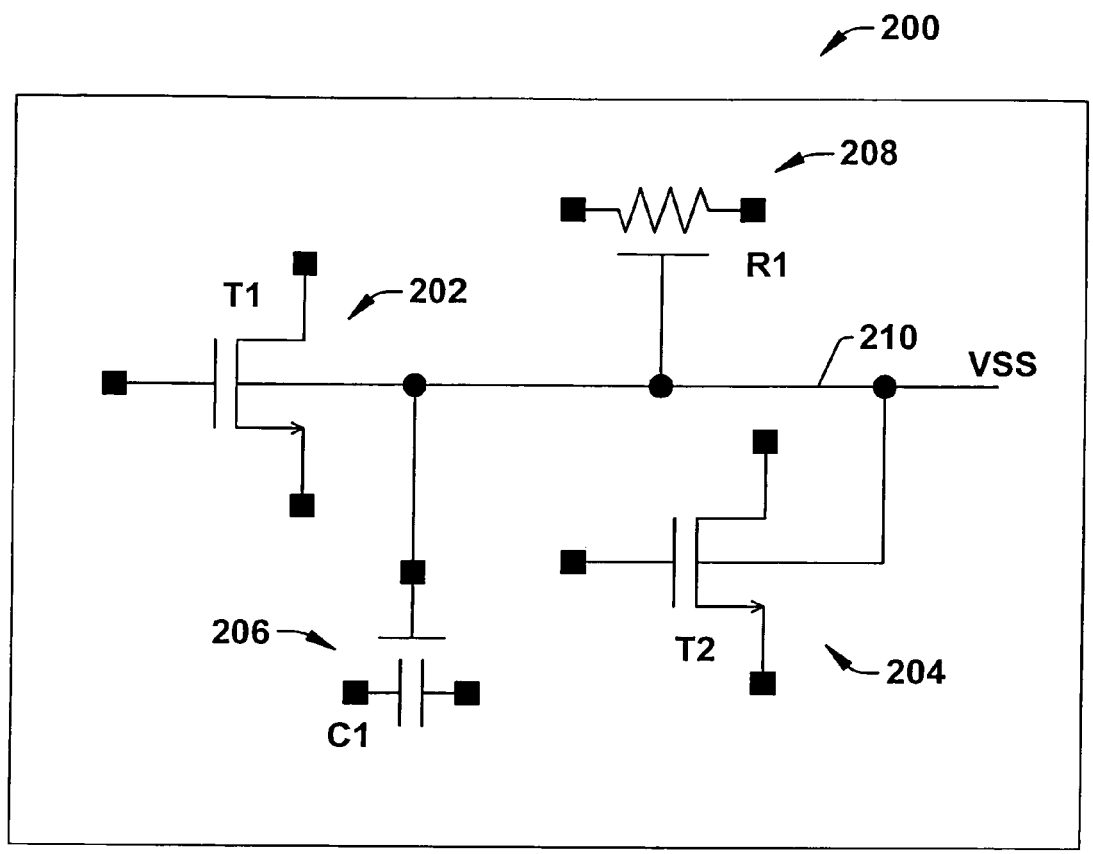
FIG. 2 is a schematic diagram of an exemplary circuit design.
Figure 3:
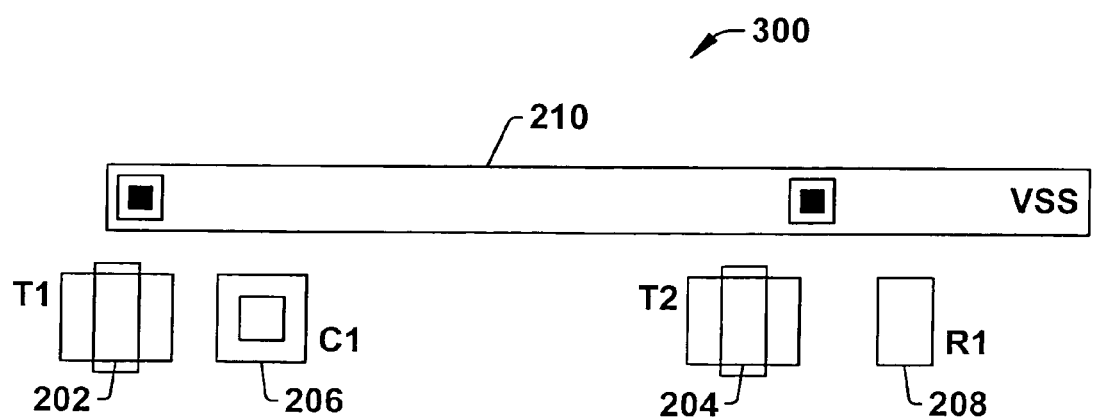
FIG. 3 is an illustration of the circuit of FIG. 2, but in layout form with no pwell isolation.

Turning to FIG. 2, a schematic diagram 200 illustrates an exemplary circuit design. The schematic 200 may correspond to a circuit design that a designer generates to solve a particular problem and/or perform a particular function, for example. After the circuit is designed, the schematic 200 can be converted to the layout forms 300, 400, 500, 600, for example, illustrated in FIGS. 3, 4, 5, 6, respectively, to facilitate forming the circuit in a semiconductor substrate. In the illustrated example, the circuit 200 comprises first 202 and second 204 transistors T1, T2, and a capacitor C1 206 and a resistor R1 208. These elements are all coupled to the same node 210, which is biased to a voltage VSS. It will be appreciated that the black squares on the devices merely represent connections points that allow the devices to be coupled to other elements, for example.

The layout forms 300, 400, 500, 600 illustrated in FIGS. 3, 4, 5, 6, respectively, are similar except for differing isolation of the elements 202, 204, 206, 208. For example, in the layout format 300 illustrated in FIG. 3, the first transistor 202 and the capacitor 206 are formed closer to one another while the second transistor 204 and the resistor 208 are formed near one another. None of the elements are, however, formed within an isolated pwell. By contrast, in the layout 400 illustrated in FIG. 4, the first transistor 202 and the capacitor 206 are formed within a first isolated pwell 220, while the second transistor 204 and the resistor 208 are formed within a second isolated pwell 222. Similarly all of the elements 202, 204, 206, 208 are formed within a single isolated pwell 224 in the layout 500 illustrated in FIG. 5. However, only the first transistor 202 and the capacitor 206 are formed in an isolated pwell 226 in the layout 600 illustrated in FIG. 6.

It will be appreciated that a general layout versus schematic (LVS) comparison would be "clean" or detect no errors between the schematic 200 illustrated in FIG. 2 and the layouts 300, 400, 500, 600 illustrated in FIGS. 3, 4, 5, 6, respectively. More particularly, the type and number of elements included in the schematic 200 are included or matched up in each of the layouts 300, 400, 500, 600 so that an LVS comparison would not raise a red flag. However, just because the elements match up doesn't mean that the layouts are devoid of issues. For example, a layout versus schematic comparison would not raise a flag if one or more of the devices 202, 204, 206, 208 were inadvertently formed inside of an isolated pwell, outside of a pwell or within the wrong isolated pwell since all of the elements in the schematic are included in the layouts 300, 400, 500, 600 and the elements are coupled to the appropriate voltage, namely VSS. By way of further example, all of the elements 202, 204, 206, 208 may be formed within a particular isolated pwell 224 as illustrated in layout 500 in FIG. 5 to satisfy a particular design rule, such as maximizing the use of valuable semiconductor real estate, for example. However, the designer may not want all of the elements to be formed within a single pwell to mitigate crosstalk or other interference between the elements, for example.

Figure 4:
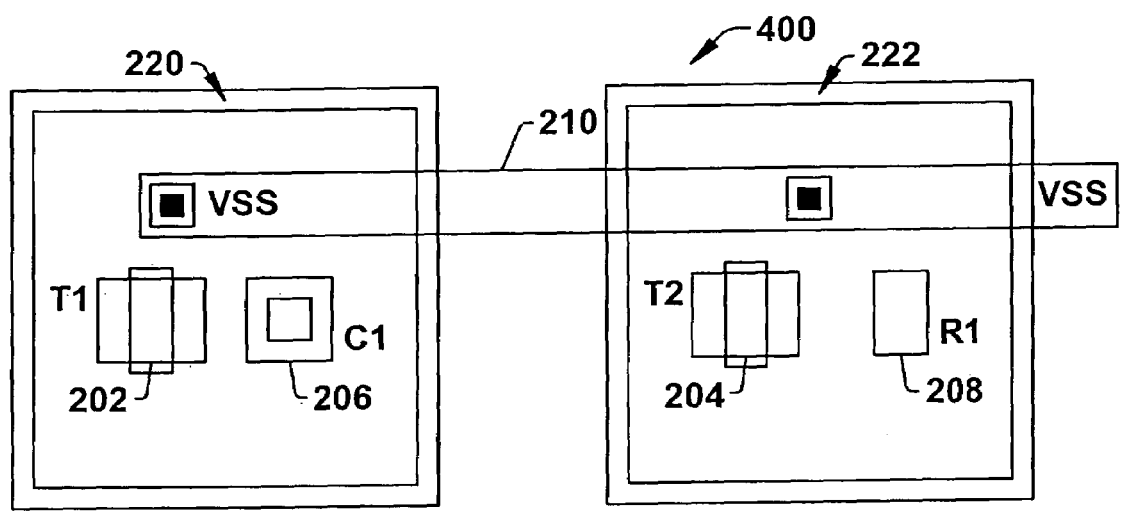
FIG. 4 is an illustration of the circuit of FIG. 2, but in layout form with two pwell isolation tanks coupled to the same node.
Figure 5:
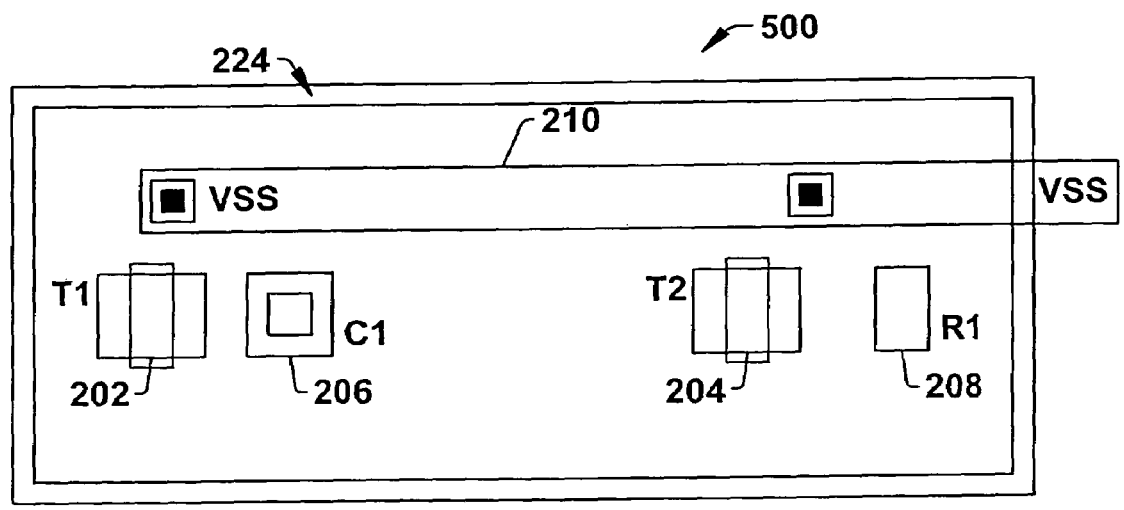
FIG. 5 is an illustration of the circuit of FIG. 2 in layout form in a single pwell isolation tank.
Figure 6:
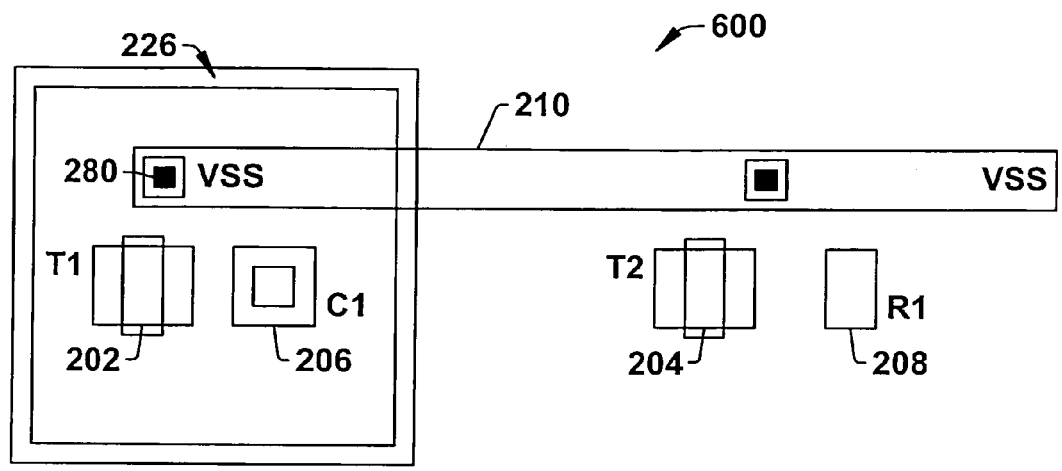
FIG. 6 is an illustration of the circuit of FIG. 2 in layout form with some elements in a pwell isolation tank and some not.

Accordingly, a scan is performed at 104 in method 100 according to one or more aspects or embodiments of the present invention to find instances where multiple isolated pwells are coupled to the same node as in layout 400 illustrated in FIG. 4. The scan at 104 also looks for instances where one or more isolated pwells are shorted to the substrate since this can present problems as well. This latter situation is illustrated in FIG. 6, for example, where the layout 600 has a single isolated pwell 226 shorted to the substrate (e.g., via connection point 280). As such, the pwell 226 is subjected to the bias of the substrate, which is VSS in the illustrated example. Transistor 202 and capacitor 206 are illustrated as being formed within pwell 226 (however any suitable elements may exist within tank 226). Since the pwell 226 and the devices therein 202, 206 are at the same potential as the substrate, however, a LVS comparison would not detect, for example, a situation where an element is inadvertently formed outside (or inside) of the pwell 226.

Figure 7:
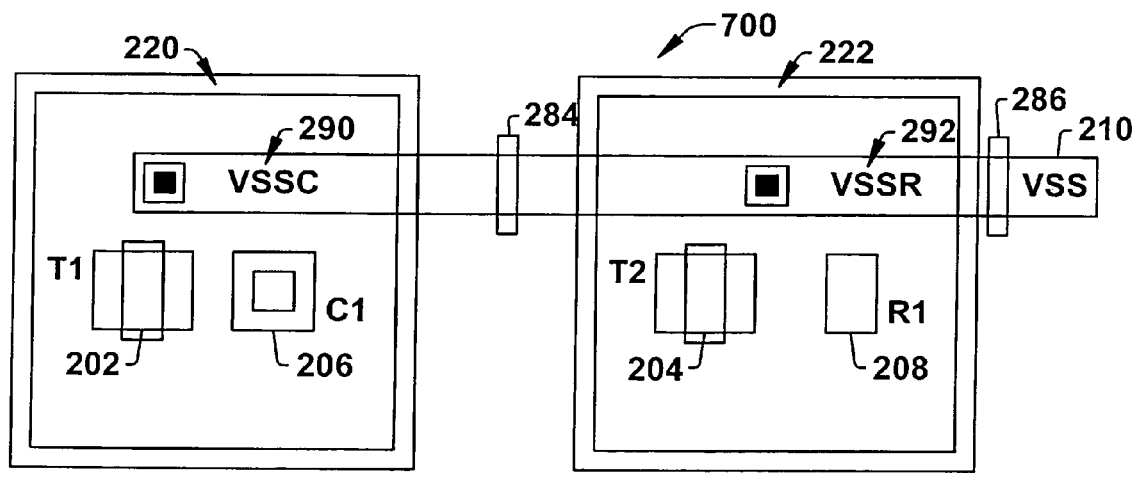
FIG. 7 illustrates the circuit of FIG. 4, but including one or more node breakers according to one or more aspects and/or embodiments of the present invention.
Figure 8:
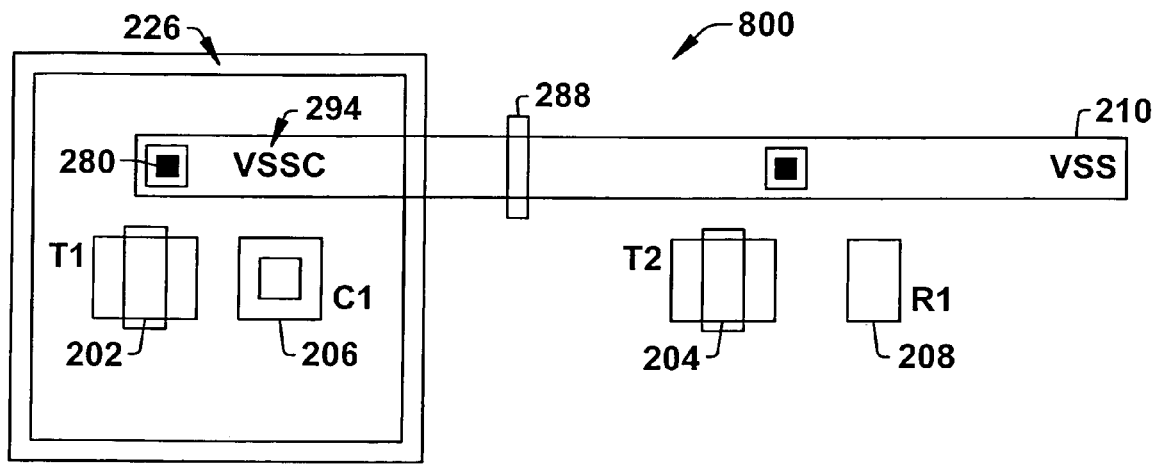
FIG. 8 illustrates the circuit of FIG. 6, but including one or more node breakers according to one or more aspects and/or embodiments of the present invention.

The method 100 thus proceeds to 106 where a node breaker is inserted between multiple isolated pwells that are coupled to the same node as well as between the substrate and isolated pwells shorted to the substrate. In FIG. 7, for example, node breakers 284 and 286 are respectively inserted between pwells 220, 222 and between pwell 222 and the substrate, or rather the substrate bias VSS in the illustrated example. Similarly, in FIG. 8 a node breaker 288 is inserted between the pwell 226 and the substrate or substrate bias VSS. It will be appreciated that multiple node breakers may be included to separate all such instances of multiple pwells coupled to the same node and pwells shorted to the substrate. This design rule check can be iteratively repeated at 108 until no more isolated pwells are coupled to the same node and no more isolated pwells are shorted to the substrate.

Inserting the node breakers causes a different voltage to be applied to the different wells. For example, node breaker 284 causes a first unique voltage VSSC 290 to be applied to tank 220, while node breaker 286 causes a second unique voltage VSSR 292 to be applied to tank 222 in FIG. 7. Similarly, node breaker 288 in FIG. 8 causes a first unique voltage VSSC 294 to be applied to the isolated pwell 226 in the layout 800. It will be appreciated that the altered voltages provide a mechanism for identifying the location of elements. For example, elements 202 and 206 associated with unique voltage 290 are thus known to be located in tank 220, while elements 204 and 208 associated with voltage 292 are known to be located in tank 222 in layout 700. Similarly, elements associated with unique voltage 294 are thus known to be located in tank 226 in layout 800. It will be appreciated that the node breakers may be resistors having a resistance value that is $\frac{1}{100}^{th}$ the resistance value of any other element in the circuit, for example. Such a small resistance value does not adversely affect the operation of the circuit, but it does alter the voltage in isolated pwell tanks by an amount sufficient to allow the location of the elements to be detected.

Figure 9:
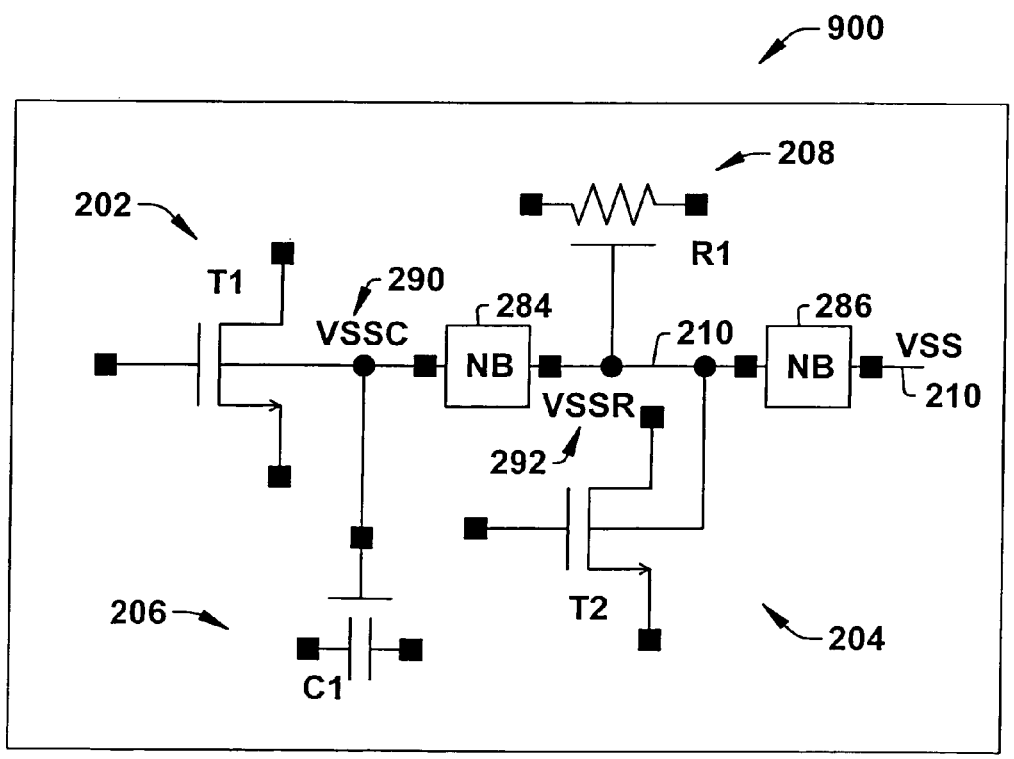
FIG. 9 is a schematic diagram of the circuit of FIG. 2, but including one or more node breakers according to one or more aspects and/or embodiments of the present invention.

Highlighting the location of the elements in the layout and thus their location in an implementation in silicon allows a designer to examine the actual physical embodiment of the circuit. This gives the designer an opportunity to check the design and confirm that the arrangement of elements is as desired. To this end, node breakers inserted in the layout at 106 and/or 108 are also inserted at corresponding locations in the circuit schematic at 110. This gives the designer another view of the circuit and thus another opportunity to check that the design is as desired. It will be appreciated that an LVS comparison may be performed at 110 to facilitate including the node breakers at all of the corresponding locations in the schematic diagram of the circuit. The LVS comparison can be iteratively run at 112 until there is no mismatch between the layout and the schematic, and more particularly until there are no locations in the schematic that lack a node breaker where corresponding locations in the layout include a node breaker. FIG. 9 illustrates a circuit schematic 900 similar to the schematic 200 of FIG. 2, but including the node breakers 284, 286 added to the layout 700 in FIG. 7. Accordingly, the circuit 900 in FIG. 9 corresponds to the layout 700 illustrated in FIG. 7.

If necessary, the circuit design is updated to achieve the designer's intended purpose. For example, the layout 700 in FIG. 7 could be adjusted so that the resistor 208 is moved from tank 222 to tank 220 so that it is associated with voltage VSSC 290, for example. An LVA comparison can be run again, for example, so that any such changes are reflected in the circuit schematic. By way of further example, the proposed circuit design, or modifications thereto, may conflict with one or more design rules that the designer may have been unaware of, but nevertheless requires a modification. For example, a design rule may dictate that no more than two elements can be included in any one isolated pwell. Thus, an attempt to move resistor 208 from tank 222 to tank 220 would (figuratively speaking) raise another red flag and not be allowed. A re-design may thus be required. The entire process may be repeated until the designer is satisfied with the layout and schematic renditions of the proposed circuit design, and LVS comparisons and other design rules are also satisfied. Accordingly, one or more aspects and/or embodiments of the present invention can help to rectify situations where elements should be in an isolated pwell, but are not (e.g., FIGS. 3 and 6), where elements are in isolated pwells but should not be (e.g., FIGS. 4, 5 and 6) and where elements are in the wrong isolated pwells (e.g., FIG. 4).

It will be appreciated that a designer may be less concerned about verifying pwell issues as described above in certain locations of the circuit since such issues may be of little concern in those areas and may have little to no impact on the operation and performance of the resulting circuit. Accordingly, since circuits are often designed in software, a program configured to implement the foregoing method may allow a designer to designate which part(s) of the circuit the method is to be applied to. Stated another way, the software may allow a designer to designate which part(s) of the circuit to ignore. Alternatively, the designer may run the program with regard to certain parts or the circuit and then disable the program and run it again with regard to remaining parts of the circuit (to which the foregoing method does not apply).

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising". It is also to be appreciated that elements and/or layers depicted herein are illustrated with particular dimensions relative to one another for purposes of simplicity and ease of understanding, and that the actual dimensions of such elements/layers may differ substantially from that illustrated herein. Also, the term "exemplary" is merely meant to mean an example, rather than "the best". Further, it is also to be appreciated that the ordering of the acts described herein can be altered and that any such re-ordering is contemplated as falling within the scope of one or more aspects of the present invention. Also, semiconductor substrate as used herein is intended to include a semiconductor wafer (e.g., silicon, SiGe, or an SOI wafer) or one or more die on a wafer, and any epitaxial layers or other type semiconductor layers formed thereover or otherwise associated therewith. And, similar areas, regions, elements, features, components, etc. presented in the different FIGS. are referenced with the same reference characters.

What is claimed is:

1. A method of verifying a circuit design in layout and schematic forms, comprising:
    checking for one or more instances where multiple isolated pwells are coupled to a same node in a layout of a circuit;
    inserting a node breaker in the layout between isolated pwells coupled to the same node;
    checking the layout for one or more instances where an isolated pwell is shorted to a substrate; and
    inserting a node breaker in the layout between the substrate and isolated pwells shorted to the substrate.

2. The method of claim 1, further comprising:
    inserting node breakers within a circuit schematic at locations corresponding to the locations in the layout where the node breakers are inserted.

3. The method of claim 2, further comprising:
    running a layout versus schematic comparison to determine where the node breakers are to be inserted in the circuit schematic.

4. The method of claim 2, where the node breakers cause different voltages to be applied to isolated pwells coupled to the same node and to isolated pwells shorted to the substrate.

5. The method of claim 4, further comprising:
examining at least one of locations of elements in the circuit and a group of elements in the circuit and modifying the circuit design if necessary.

6. The method of claim 5, where the modifying is made in the layout and the circuit schematic is adapted to match the modified layout.

7. The method of claim 6, further comprising:
running a layout versus schematic comparison.

8. The method of claim 5, where the method is implemented as computer software and further comprises:
checking for one or more instances where the multiple isolated pwells are coupled to the same node and for one or more instances where an isolated pwell is shorted to the substrate once an enable activity has occurred.

9. The method of claim 1, where the node breakers comprise resistors.

10. The method of claim 9, where the node breakers have resistance values that are $1/100^{th}$ resistance value of any other element in the circuit.

11. The method of claim 1, where the circuit is designed in a schematic form and then converted to the layout that is checked.

12. A method for implementing a design rule for transferring a circuit design from a schematic form to a layout form to facilitate forming a circuit on a semiconductor substrate, comprising:
checking a layout for an instance where multiple isolated pwells are coupled to a same node;
inserting a node breaker in the layout between isolated pwells coupled to the same node;
checking the layout for an instance where one or more isolated pwells are shorted to the semiconductor substrate; and
inserting a node breaker in the layout between the semiconductor substrate and isolated pwells shorted to the semiconductor substrate.

13. The method of claim 12, further comprising:
inserting node breakers within a circuit schematic at locations corresponding to the locations in the layout where the node breakers are inserted.

14. The method of claim 13, further comprising:
running a layout versus schematic comparison to determine where the node breakers are to be inserted in the circuit schematic.

15. The method of claim 14, where the node breakers cause different voltages to be applied to isolated pwells coupled to the same node and to isolated pwells shorted to the semiconductor substrate.

16. A method of verifying a circuit design in layout and schematic forms, comprising:
checking for one or more instances where multiple isolated pwells are coupled to a same node in a layout of a circuit and where an isolated pwell is coupled to a substrate;
inserting a node breaker in the layout between isolated pwells coupled to the same node and between the substrate and isolated pwells coupled to the substrate; and
inserting node breakers at corresponding locations in a circuit schematic.

17. The method of claim 16, where the inserting node breakers at corresponding locations in a circuit schematic comprises:
running a layout versus schematic comparison to determine where the node breakers are to be inserted in the circuit schematic.

18. The method of claim 17, where the checking for one or more instances where multiple isolated pwells are coupled to a same node in a layout of a circuit and where an isolated pwell is coupled to a substrate comprises:
running a design rule checker program.

19. The method of claim 18, further comprising:
repeatedly running the design rule checker until there are no more instances of multiple isolated pwells coupled to the same node or isolated pwells coupled to the substrate.

20. The method of claim 19, further comprising:
repeatedly running the layout versus schematic comparison until there is no node breaker mismatch between the layout and schematic representations of the circuit design.

* * * * *